US006765303B1

(12) United States Patent
Krivokapic et al.

(10) Patent No.: US 6,765,303 B1
(45) Date of Patent: Jul. 20, 2004

(54) FINFET-BASED SRAM CELL

(75) Inventors: Zoran Krivokapic, Santa Clara, CA (US); Judy Xilin An, San Jose, CA (US); Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/429,697

(22) Filed: May 6, 2003

(51) Int. Cl.[7] .............................................. H01L 27/11
(52) U.S. Cl. ........................ 257/903; 257/368; 257/25; 365/175
(58) Field of Search ................................ 257/903, 368, 257/25, 347, 401; 365/175, 182

(56) References Cited

U.S. PATENT DOCUMENTS

| | | | |
|---|---|---|---|
| 4,996,574 A | * | 2/1991 | Shirasaki .................. 357/23.7 |
| 6,316,305 B1 | | 11/2001 | Noble ......................... 438/237 |
| 6,445,017 B2 | | 9/2002 | Song ........................... 257/204 |

OTHER PUBLICATIONS

Digh Hisamoto et al.: "FinFET—A Self-Aligned Double-–Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin FET Technologies," 0–7803–5410–9/99 IEEE, Mar. 2001, 4 pages.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 0–7803–7050–3/01 IEEE, Sep. 1999 4 pages.

J. I. Bergman et al.: "RTD/CMOS Nanoelectric Circuits: Thin–Film InP–Based Resonant Tunneling Diodes Integrated with CMOS Circuits," IEEE Electron Device Letters, vol. 20, No. 3, Mar. 1999, pp. 119–122.

A. Seabaugh et al.: "Transistors and Tunnel Diodes For Analog/Mixed–Signal Circuits and Embedded Memory," IEDM, Dec. 8 1998, 4 pages.

* cited by examiner

Primary Examiner—Mark V. Prenty
(74) Attorney, Agent, or Firm—Harrity & Snyder LLP (57) ABSTRACT

A SRAM cell includes a single FinFET and two resonant tunnel diodes. The FinFet has multiple channel regions formed from separate fins. The resonant tunnel diodes may be formed from FinFET type fins. In particular, the resonant diodes may includes a thin, undoped silicon region surrounded by a dielectric. The SRAM cell is small and provides fast read/write access times.

19 Claims, 12 Drawing Sheets

FINFET-BASED SRAM CELL

BACKGROUND OF THE INVENTION

A. Field of the Invention

The present invention relates generally to semiconductor manufacturing and semiconductor devices and, more particularly, to static random access memories (SRAMs).

B. Description of Related Art

SRAM is random access memory that retains its stored data as long as power is supplied to the SRAM cells. Unlike dynamic RAM (DRAM), which stores bits in cells consisting of a capacitor and a transistor, SRAM does not have to be periodically refreshed. SRAM generally provides faster memory bit access than DRAM.

One conventional SRAM cell include six transistors arranged as cross-coupled inverters to form a flip-flop. Other conventional SRAM cells include a single transistor and two tunnel diodes. The single transistor in this SRAM may be a MOSFET type transistor.

Conventional MOSFETs have difficulty scaling below 50 nm fabrication processing. To develop sub-50 nm MOSFETs, double-gate MOSFETs have been proposed. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

It would be desirable to more efficiently implement an SRAM cell, as this would increase the overall efficiency of the semiconductor memory devices.

SUMMARY OF THE INVENTION

Implementations consistent with the present invention include an SRAM cell using a single FinFET transistor and two tunnel diodes formed from FinFET fins.

One aspect of the invention is directed to an SRAM cell that includes a FinFET that has multiple channel regions each formed by a separate fin of the FinFET. The SRAM cell further includes a memory node connected to the FinFET and first and second resonant tunnel diodes. The first resonant tunnel diode has two terminals, one of the two terminals being connected to the memory node. The second resonant tunnel diode has two terminals, one of the two terminals being connected to the memory node.

A second aspect of the invention is directed to an SRAM cell that includes a switch, a memory node, and first and second resonant tunnel diodes. The first and second resonant tunnel diodes have two terminals. One of the two terminals of each resonant tunnel diode is connected to the memory node. The first and second resonant diodes are formed from an undoped fin surrounded by a dielectric layer.

BRIEF DESCRIPTION OF THE DRAWINGS

Reference is made to the attached drawings, wherein elements having the same reference number designation may represent like elements throughout.

FIGS. 10(A–C), 11 and 12 are cross-section views illustrating the formation of the multi-fin FinFET shown in FIG. 2;

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

An SRAM cell includes a single FinFET and two tunnel diodes. The diodes may be formed using a FinFET-type fin structure. The FinFET may include multiple fins, which help to increase current through the pass gate and improve read time.

SRAM Cell

Figure 1:
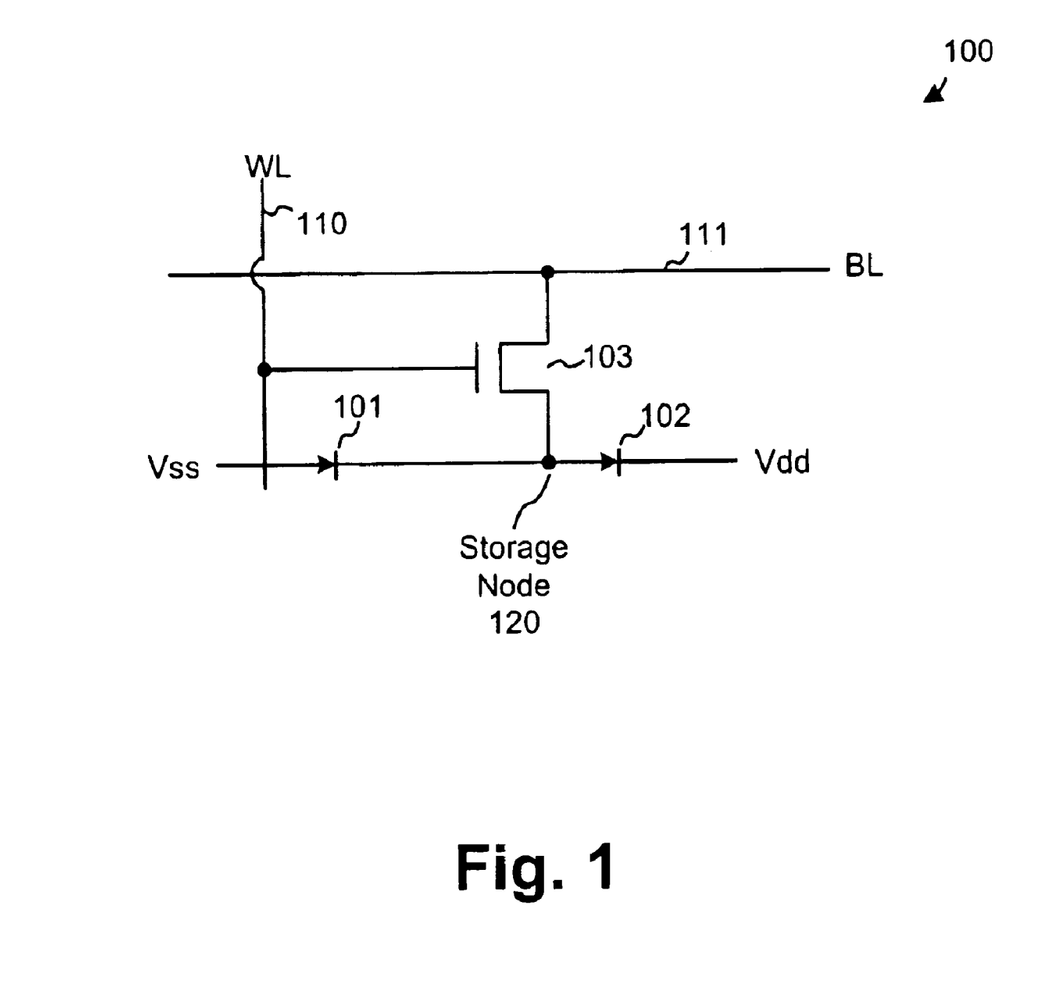
FIG. 1 is a schematic circuit diagram of an SRAM cell.

FIG. 1 is a schematic circuit diagram of an SRAM cell 100. Two tunnel diodes 101 and 102 are connected in series between a voltage source (Vss) and a voltage ground (Vdd). Word line (110) and bit line (111) control reading/writing to the SRAM cell 100. A switch 103, such as a MOSFET, is connected at its source to BL 111, at its gate to WL 110, and at its drain to node 120. Node 120 acts as the data storage node for the SRAM cell 100.

Tunnel diodes 101 and 102 cause storage node 120 to exhibit two stable states (described in more detail below). The two stable states correspond to binary storage states (i.e., "0" and "1") for the SRAM cell. In operation, when WL 110 is active, switch 103 connects BL 111 to storage node 120. For a write operation, BL 111 then sets node 120 to the desired stable storage state. When WL 110 is turned off, storage node 120 maintains the set storage state as long as power is supplied through Vss. Reading the state of storage node 120 may be accomplished by using a voltage sense amplifier to sense the voltage on BL 111 when WL 110 is activated.

Figure 2:
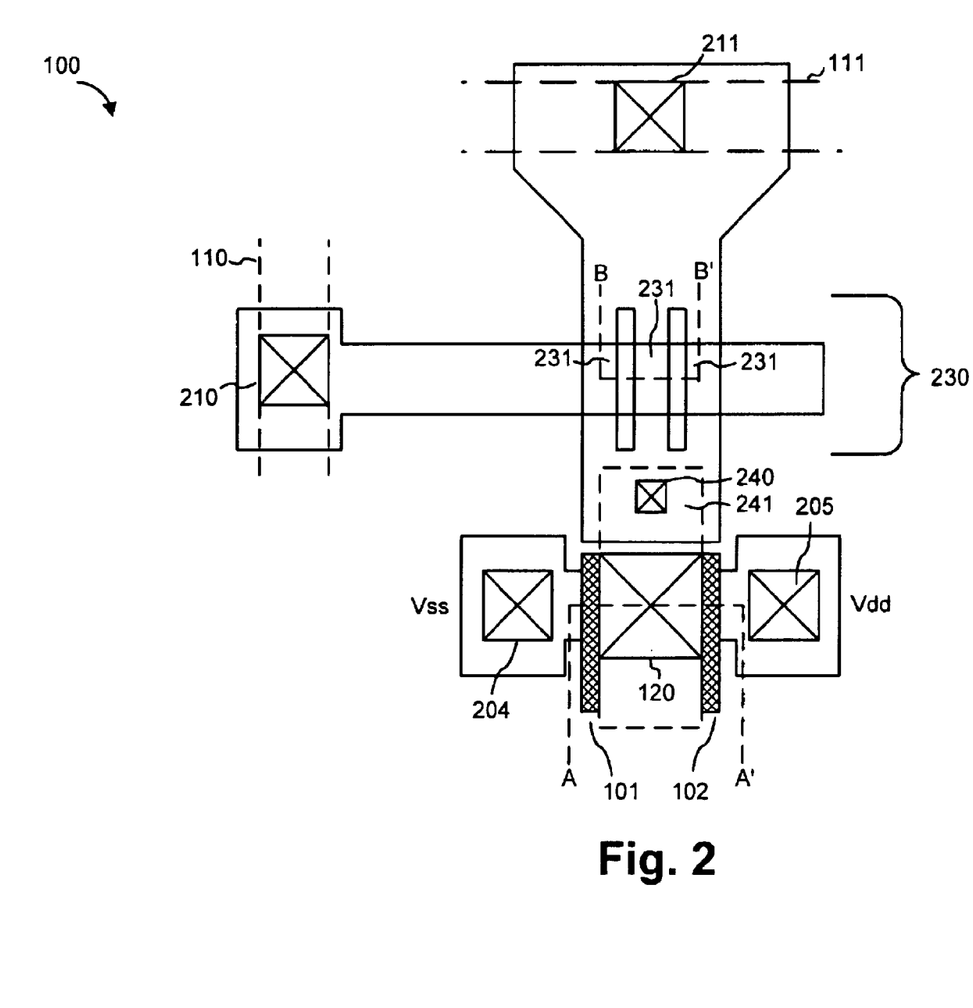
FIG. 2 is a diagram illustrating a top-level view of a semiconductor implementation of an SRAM cell consistent with an aspect of the invention.

FIG. 2 is a top-level view of a semiconductor implementation of SRAM call 100 in an implementation consistent with principles of the invention. Tunnel diodes 101 and 102 may be formed as a thin silicon (Si) "fin" that intersects a conductive region between Vss and Vdd. Pads 204 and 205 provide electrical contacts for Vss and Vdd, respectively.

Pad 211 provides a contact point for BL 111 and pad 210 provides a contact point for WL 110.

As shown, tunnel diode 101 has two terminals—one connected to node 204 and the other to storage node 120. Similarly, tunnel diode 102 has two terminals—one connected to node 205 and the other to storage node 120.

Switch 103 may be implemented as a FinFET 230 formed between pad 211 and storage node 120. In terms of the FinFET, pad 211 may implement the source for FinFET 230 and storage node 120 may implement the drain for FinFET 230. Pad 210 forms the gate contact for FinFET 230. The channel area of FinFET 230 may include multiple silicon fins 231. Current flows from the source of FinFET 230 to the drain through fins 231.

FinFET 230 is not connected to tunnel diodes 101 and 102 in silicon. Instead, a contact 240 is included in the drain area of FinFET 230 that connects to node 120 through metal line 241.

Figure 3:
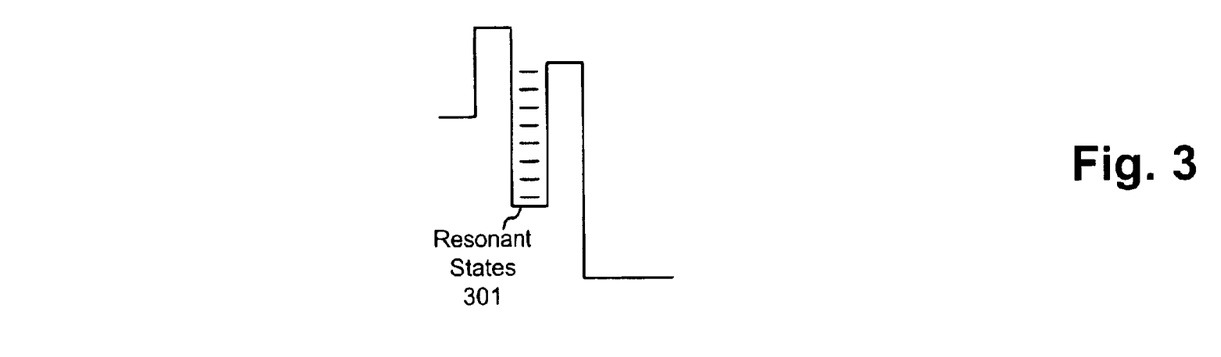
FIG. 3 is a band diagram illustrating resonant states for fins in the tunnel diodes shown in FIG. 2.
Figure 4:
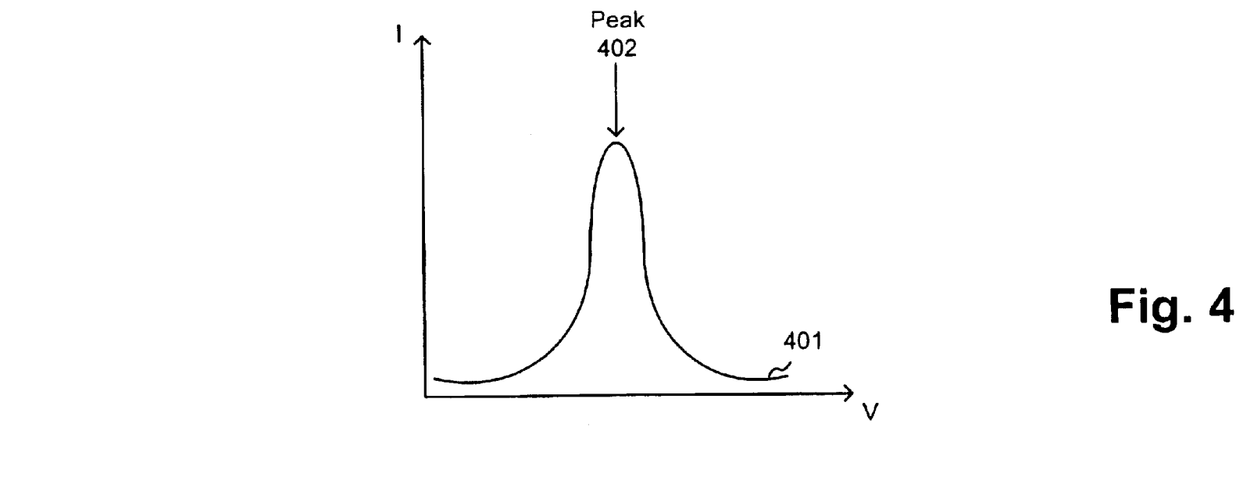
FIG. 4 is a plot of the current versus voltage characteristic curve of one of the tunnel diodes shown in FIG. 2.

FIG. 3 is a band diagram illustrating resonant states for the fins that comprise tunnel diodes 101 and 102. Area 301 represents the resonant states that occur in the fin. FIG. 4 is a plot of the current versus voltage characteristic curve 401 of one of tunnel diodes 101 or 102. The peak current level 402 is caused by resonant state 301 in the tunnel diode.

Figure 5:
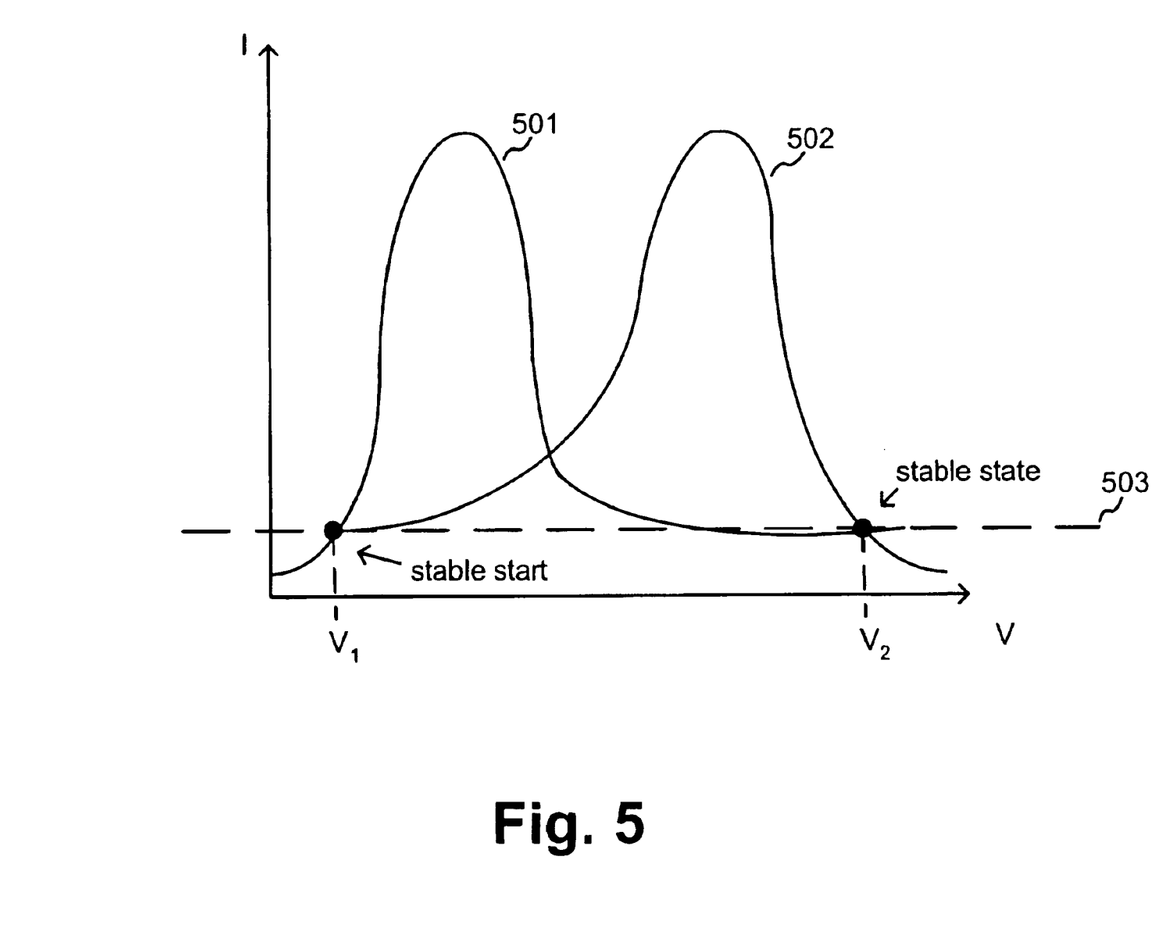
FIG. 5 is a plot of the current versus voltage characteristic curves for the series combination of the tunnel diodes shown in FIG. 2.

FIG. 5 is a plot of the current versus voltage characteristic curves for the series combination of tunnel diodes 101 and 102. The two curves shown in FIG. 5, labeled as curves 501 and 502, correspond to the current versus voltage curves for the two tunnel diodes 101 and 102. Line 503 illustrates two stable states for tunnel diodes 101 and 102. At the stable states, the current through tunnel diodes 101 and 102 is equal. The voltage across the two tunnel diodes 101 and 102 is $V_1$ and $V_2$ at these stable states. Vss may be set to the value of $V_1 + V_2$. Storage node 120 can thus remain stable at either $V_1$ or $V_2$ volts, thus providing two stable storage states.

Tunnel Diodes

Tunnel diodes 101 and 102 will now be described in more detail with reference to FIGS. 6–9.

Figure 6:
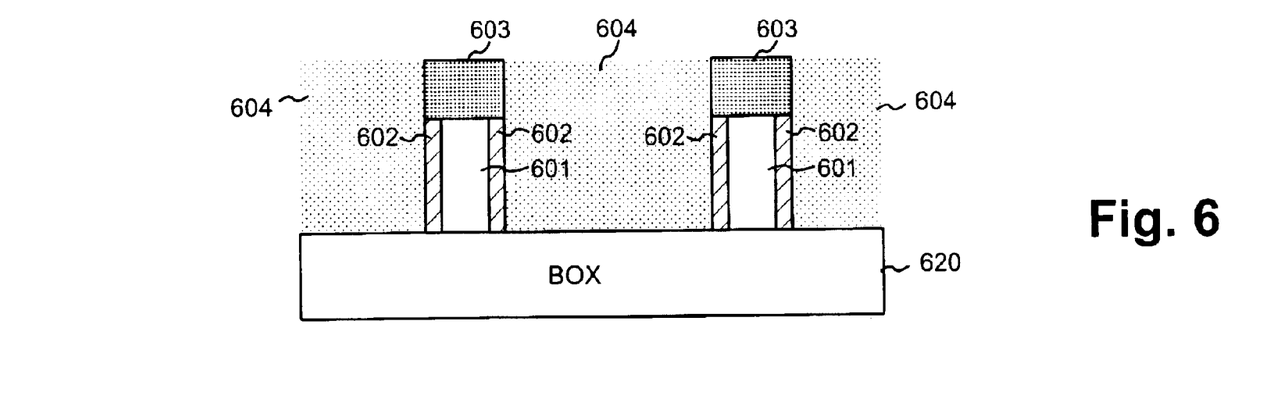
FIG. 6 is a cross-section of one of the tunnel diodes taken along the line A–A' in FIG. 2.

FIG. 6 is a cross-section of tunnel diodes 101 and 102 taken along the line A–A' in FIG. 2. The tunnel diodes 101 and 102 may each include an undoped silicon fin 601, a dielectric layer 602 that surrounds the fin 601, and protective layer 603. Doped polysilicon regions 604 surround the fins. Polysilicon regions 604 form the conductive regions around the fins 101 and 102. Polysilicon region 604 may be doped with, for example, n-type impurities to a concentration of $5 \times 10^{20}$ atoms/cm$^3$. Tunnel diodes 101 and 102, as well as the entire SRAM cell 100, may be formed on buried oxide (BOX) layer 620. In an exemplary implementation, BOX layer 620 may have a thickness ranging from about 200 nm to about 400 nm.

Figure 7:
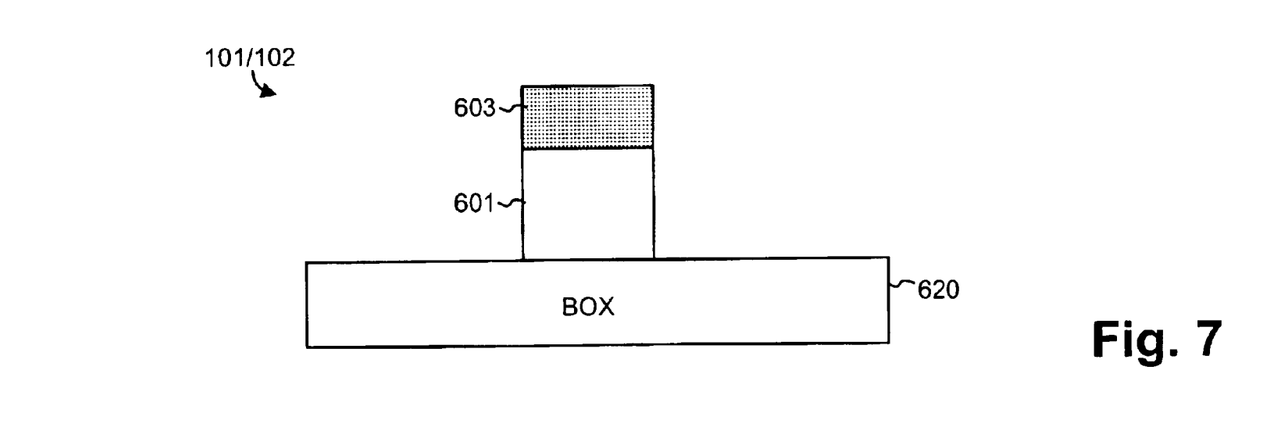
FIGS. 7–9 are cross-section views illustrating exemplary steps in the formation of the tunnel diode shown in FIG. 6.
Figure 8:
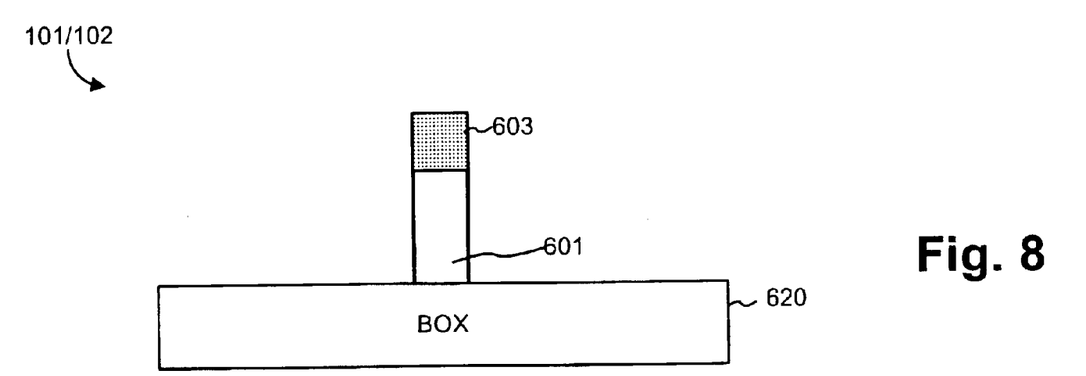
Figure 9:
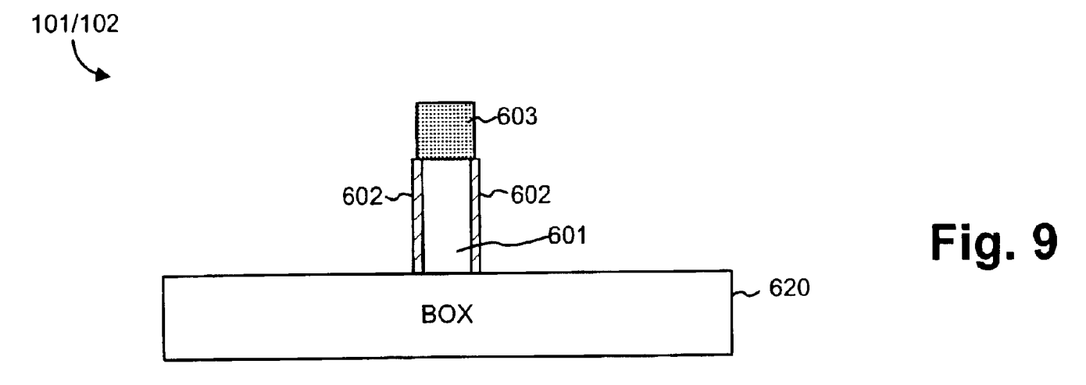

FIGS. 7–9 illustrate exemplary steps in the formation of one of the tunnel diodes shown in FIG. 6. Each of the tunnel diodes 101 and 102 are formed similarly. FIG. 7 is a cross-section of tunnel diode 101/102 after a silicon layer and a protective layer have been deposited and etched to form fin 601 and protective layer 603. Protective layer 603 may be, for example, an oxide layer, a nitride layer, or a combination of a nitride layer deposited above an oxide layer. In one implementation, protective layer 603 is an oxide layer deposited to a depth of about 15 nm followed by a nitride layer deposited to a depth of about 50 nm to 75 nm. Fin 601 may be deposited to a depth of about 30 nm to about 100 nm.

Fin 601 may next be thinned. In one embodiment, fin 601 may be thinned by exposing it to NH$_4$OH until fin 601 is reduced to a width of approximately 5 nm. Protective layer 603 may be correspondingly thinned. A fin that is thinned in this manner is illustrated in FIG. 8.

Referring to FIG. 9, by oxidizing the surface of fin 601, gate dielectric layers 602 may be grown on the side surfaces of fin 1601. Gate dielectric layers 1602 may have a width ranging from about 0.6 nm to 0.9 nm.

A layer of polysilicon may next be deposited around fin 601 to thus form the final diode structure illustrated in FIG. 6. In one implementation, polysilicon layer 604 is doped with phosphorous to a concentration of about $5 \times 10^{20}$ atoms/cm$^3$.

FinFET

In general, a FinFET is a type of double-gate MOSFET in which a conducting channel is formed in a vertical Si "fin." Consistent with an aspect of the invention, FinFET 230 may include multiple fins 231. The multiple fins can help to increase current through the FinFET and thus improve the read time of SRAM 100. While the formation of two fins will be described hereafter, it will be appreciated that a FinFET device in accordance with the principles of the present invention may be formed with more than two fins.

Figure 10A:
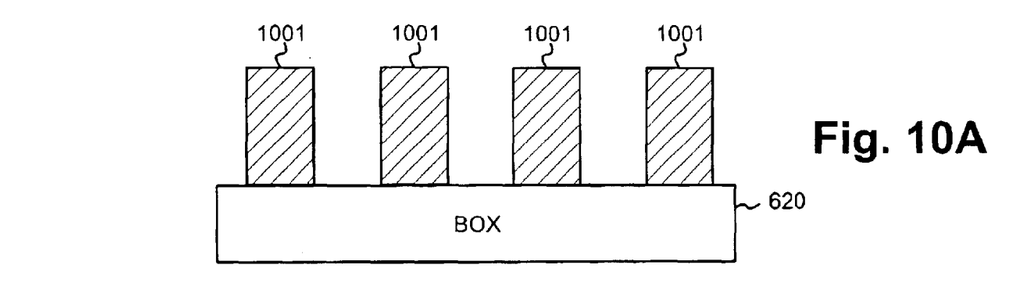
Figure 10B:
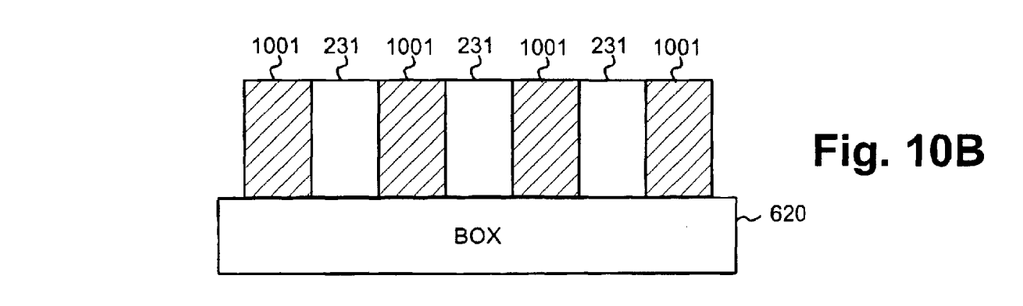
Figure 10C:
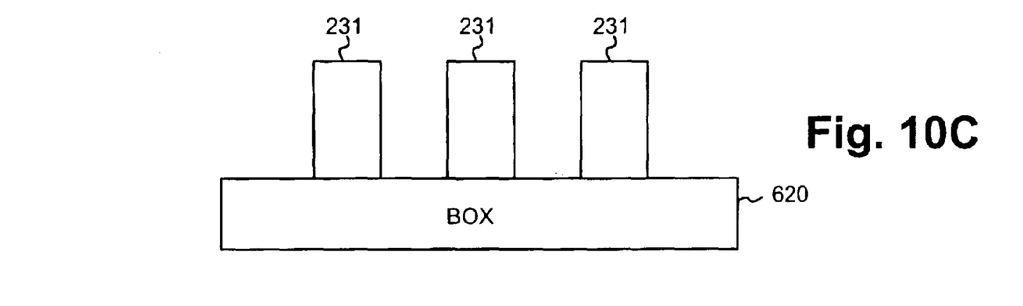

The formation of multi-fin FinFET 230 will next be described with reference to FIGS. 10–12, which are cross-sectional views taken along the line B–B' in FIG. 2. A silicon layer, such as silicon layer 601, may be disposed on BOX layer 620 and etched to create the source, drain, and fins 231 of FinFET 230. In one implementation, referring to FIG. 10A, to create the multiple fins 231, an oxide layer may first be deposited, patterned, and etched to form oxide "fins" 1001. As shown in FIG. 10B, silicon layer 601 may then be deposited and planarized to produce silicon fins 231. The oxide may then be selectively etched away, leaving only the silicon fins 231 (FIG. 13C). In one implementation, fins 231 may range from, for example, approximately 10 nm to about 30 nm in width.

The source and drain regions of FinFET 230 may be formed during the deposition of silicon layer 601 or through the deposition of another silicon layer after silicon layer 601 is formed.

Figure 11:
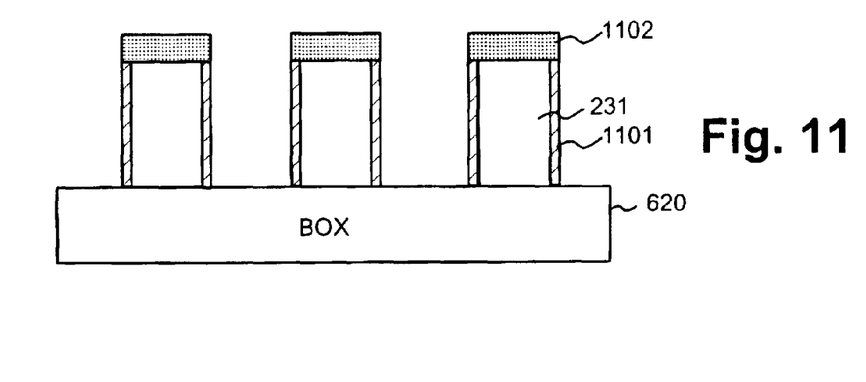

Referring to FIG. 11, by oxidizing the silicon surface of fins 231, gate dielectric layers 1101 may be grown on the surfaces of fins 231. The width of gate dielectric layers 1101 may range from about 0.8 nm to about 2 nm. In some implementations, a protective layer 1102 may be formed on the top surface of fins 231. The protective layer 1102 may be a silicon nitride layer. In other implementations, protective layer may simply be another oxide layer 1101.

Figure 12:
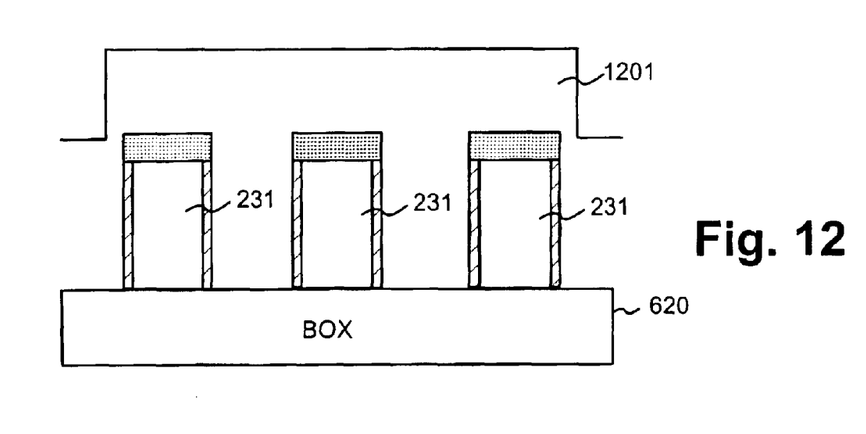

Referring to FIG. 12, gate material layer 1201 may next be deposited over fins 231. Gate material layer 1201 may be polysilicon or metal or metal alloys. At this point, FinFET 230 may be implanted with a dopant to dope the source and drain regions. For a NMOS device, the dopant may be, for example, As$^+$ or P$^+$. In some implementations, a metal layer may next be deposited on FinFET 230 and then thermally annealed to create a metal silicide compound for the source, drain, and gate regions. The metal may be, for example, tungsten, cobalt, titanium, tantalum, molybdenum, nickel, or erbium.

The multi-fin FinFET 230, by having multiple channels, allows for increased current flow that can thus lead to faster access times for SRAM cell 100.

The SRAM cell 100 described above included tunnel diodes that are approximately 5 nm thick. In other implementations, diodes 101 and 102 may be made slightly thicker (i.e., 5–10 nm thick). In this situation, the plot of the current versus voltage characteristic curve for one of the tunnel diodes has two resonant peaks instead of the single peak shown in FIG. 4. The combination of two such diodes may have four stable states instead of the two stable states shown in FIG. 5.

Figure 13:
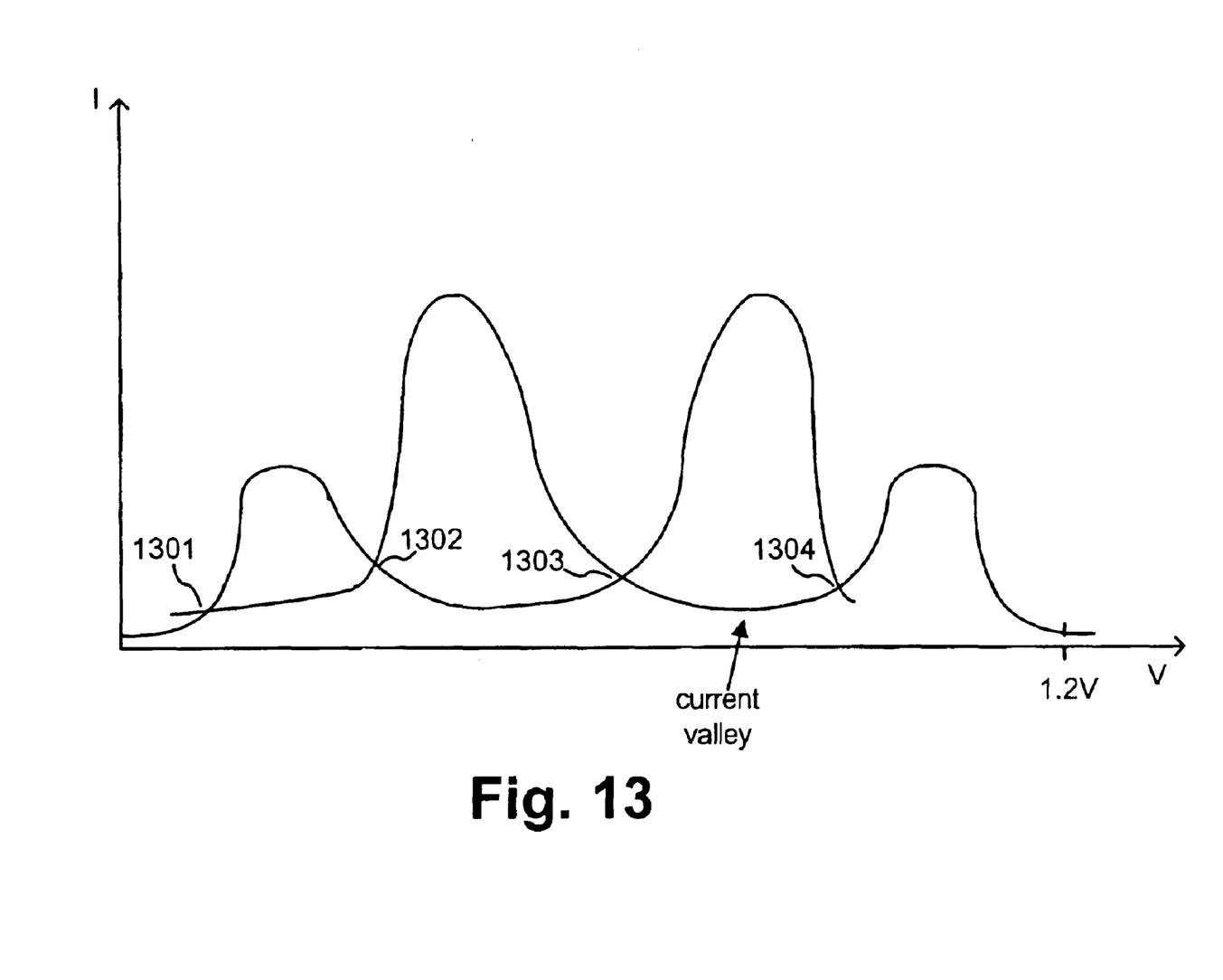
FIG. 13 is a plot of the current versus voltage characteristic curves for the series combination of a thicker version of the tunnel diodes shown in FIG. 2.

FIG. 13 is a plot of the current versus voltage characteristic curve for a series combination of slightly thicker tunnel diodes 101 and 102 for a 1.2V power supply. As shown, there are four stable logic levels 1301, 1302, 1303, and 1304. This enables SRAM cell 100 to store four different logic states, thus increasing memory density. Relative to the plot shown in FIG. 5, the valley current may be higher than that in FIG. 5, potentially causing higher off-state leakage for the SRAM cell.

Other Implementations

Figure 14:
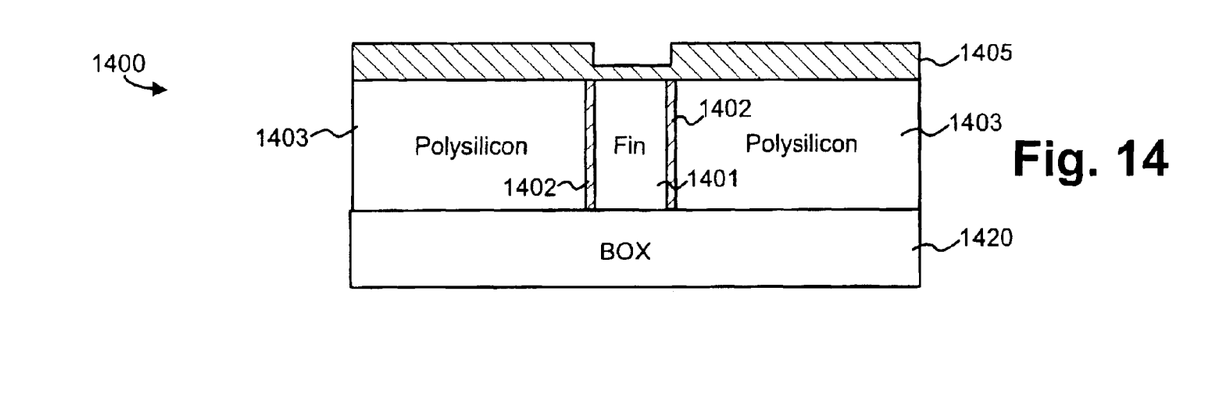
FIGS. 14–16 are cross-section views illustrating the deposition of a layer of dummy metal that may be used to strain the channel of FinFET.
Figure 15:
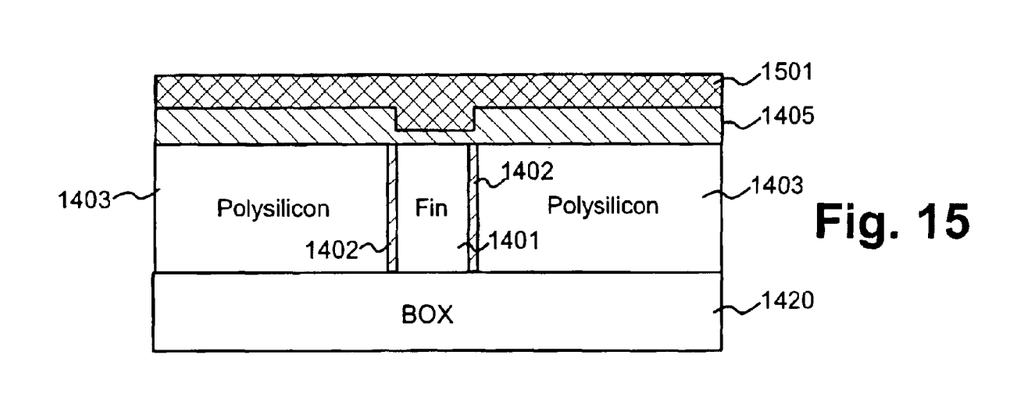
Figure 16:
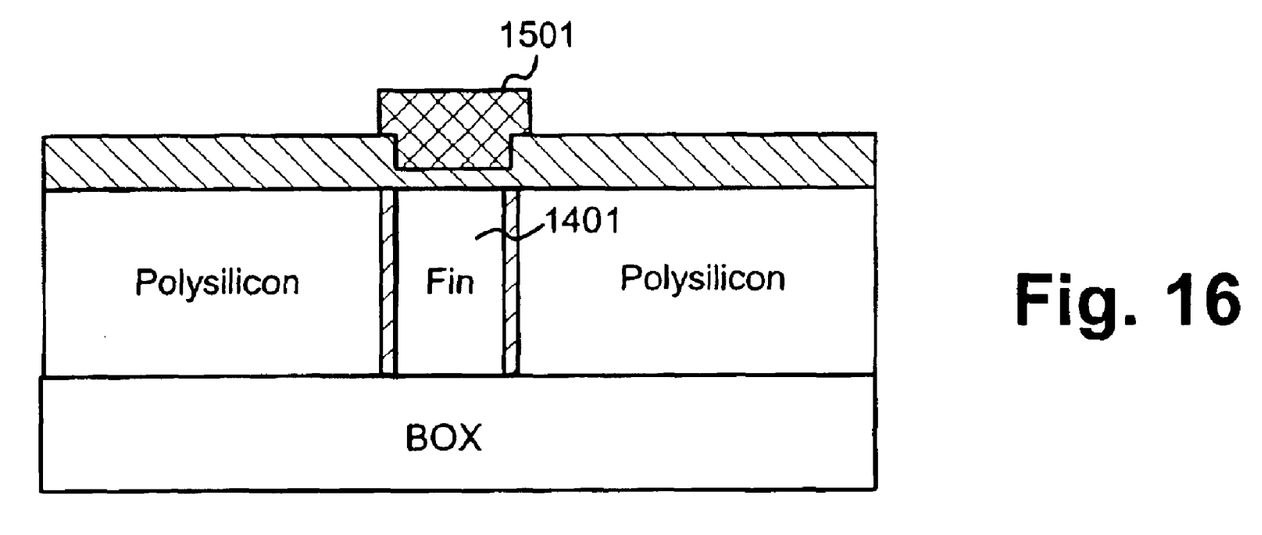

In some FinFET devices it may be desirable to deposit a layer of dummy metal that is used to strain the channel. FIGS. 14–16 illustrate deposition of such a layer of metal.

FIG. 14 is a cross-section of a FinFET 1400 taken along an orientation such as the line B–B' in FIG. 2. At this point, a fin 1401 is formed on a BOX layer 1420. Dielectric layers 1402 have been deposited around fin 1401 followed by polysilicon layers 403. Polysilicon layer 1403 may then be planarized and FinFET 1400 may then be oxidized to grow an oxide layer 1405 on polysilicon layer 1403 and fin 1401. Oxide layer 1405 may be grown to a depth of about 20 nm to 30 nm over polysilicon layer 1403 and about 5 nm to 7 nm over fin 1401.

After oxide layer 1405 is grown, metal layer 1501 may be deposited (FIG. 15). Metal layer 1501 may be, for example, a layer of Ni deposited to a depth of about 20 nm to 80 nm. One of ordinary skill in the art will recognize that other metals could alternatively be used. The metal should be one that does not diffuse through oxide layer 1405. Referring to FIG. 16, metal layer 1501 may next be patterned to cover fin 1401. The metal layer 1501 over fin 1401 acts as a dummy layer which will cause strain on fin 1401.

Figure 17:
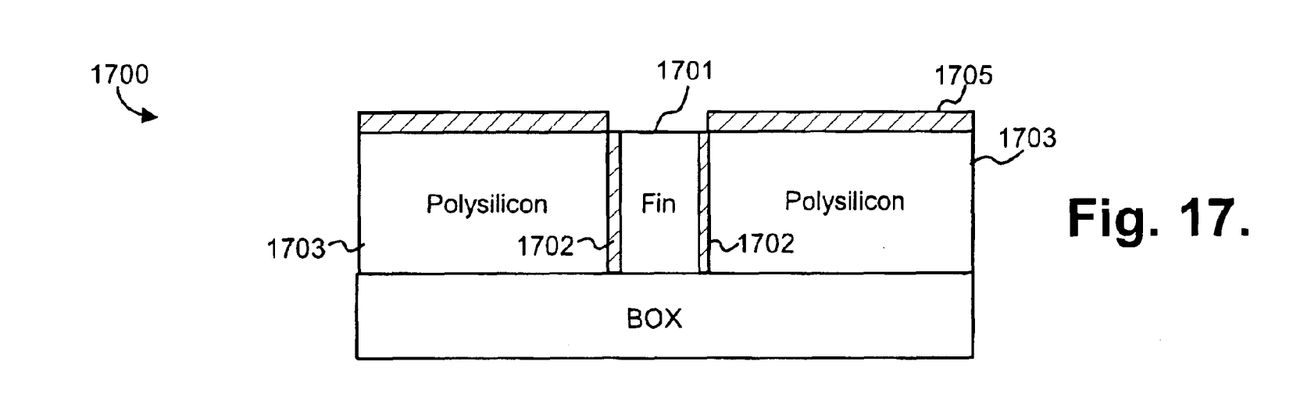
FIGS. 17 and 18 are cross-section views illustrating the formation of a FinFET with an expanded vertical fin.
Figure 18:
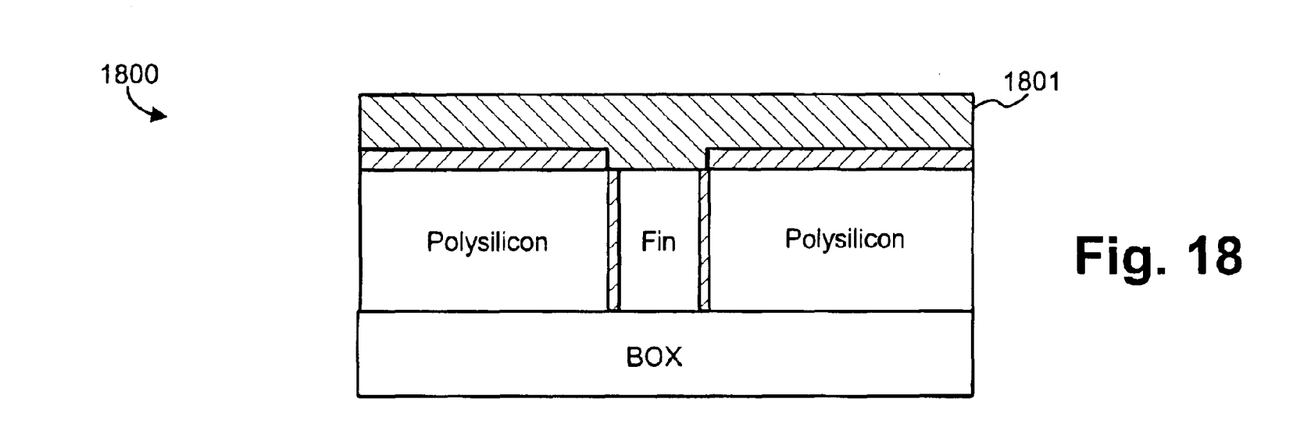

In yet another implementation, FinFETs may be created with expanded vertical fins. A process for forming such a FinFET, labeled as FinFET 1700, is illustrated in FIGS. 17 and 18. FinFET 1700 is initially formed in a manner similar to the FinFET formed in FIG. 14. In particular, a fin 1701 may be formed on BOX layer 1700. Dielectric layers 1702 may be deposited around fin 1701 followed by polysilicon layer 1703. Polysilicon layer 1703 may be planarized. FinFET 1700 may then be oxidized to grow an oxide layer 1705 on polysilicon layer 1703 and fin 1701. At this point, the FinFET is similar to the FinFET shown in FIG. 14.

Referring to FIG. 17, a mask may then be applied and used to etch oxide layer 1705 from fin 1701, leaving oxide layer 1705 over the gate area. Referring to FIG. 18, a layer of silicon 1801 may then be deposited through a selective epitaxial growth (SEG) process. FinFET 1700 is thus formed as a silicon around gate device.

Conclusion

A SRAM cell may be formed from a single multi-fin FinFET and two resonant tunnel diodes. The resonant tunnel diodes may be formed from FinFET type fins. The SRAM cell may be extremely small and provide fast read/write access times.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 50 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A static random access memory (SRAM) cell comprising:
   a FinFET configured to have multiple channel regions each formed by a separate fin of the FinFET;
   a memory node connected to the FinFET;
   a first resonant tunnel diode having two terminals and including a first undoped silicon fin, one of the two terminals of the first resonant tunnel diode being connected to the memory node; and
   a second resonant tunnel diode having two terminals and including a second undoped silicon fin, one of the two terminals of the second resonant tunnel diode being connected to the memory node.

2. The SRAM cell of claim 1, wherein the first and second undoped silicon fins are about 5 nm wide.

3. The SRAM cell of claim 1, wherein each of the first and second resonant tunnel diodes include:
   a dielectric layer surrounding the first and second undoped silicon fins.

4. The SRAM cell of claim 1, wherein the FinFET includes:
   a source region;
   a drain region; and
   a gate region, wherein
      the memory node is connected to the drain region of the FinFET.

5. The SRAM cell of claim 1, wherein a second terminal of the first resonant diode is connected to a power supply.

6. The SRAM cell of claim 1, wherein a second terminal of the second resonant diode is connected to ground.

7. The SRAM cell of claim 1, wherein the first and second undoped silicon fins are about 5–10 nm wide, whereby a current-voltage characteristic curve of a series connection of the first and second resonant tunnel diodes includes four stable states.

8. A static random access memory (SRAM) cell comprising:
- a switch;
- a memory node connected to the switch;
- a first resonant tunnel diode having two terminals, one of the two terminals of the first resonant tunnel diode being connected to the memory node, the first resonant diode being formed from an undoped fin surrounded by a dielectric layer;
- a second resonant tunnel diode having two terminals, one of the two terminals of the second resonant tunnel diode being connected to the memory node, the second resonant diode being formed from an undoped fin surrounded by a dielectric layer.

9. The SRAM cell of claim 8, wherein the switch includes:
- a multiple channel FinFET.

10. The SRAM cell of claim 9, wherein each of the multiple channels of the FinFET include a semiconductor fin formed to a width of about 10 nm to about 30 nm.

11. The SRAM cell of claim 8, wherein the undoped silicon fins of the first and second resonant tunnel diodes are about 5–10 nm wide.

12. The SRAM cell of claim 11, wherein each of the first and second resonant tunnel diodes further includes:
- a dielectric layer surrounding the undoped silicon fin.

13. The SRAM cell of claim 10, wherein the FinFET includes:
- a source region;
- a drain region; and
- a gate region, wherein
  - the memory node is connected to the drain region of the FinFET.

14. The SRAM cell of claim 8, wherein a second terminal of the first resonant diode is connected to a power supply.

15. The SRAM cell of claim 14, wherein a second terminal of the second resonant tunnel diode is connected to ground.

16. A memory device comprising:
- a word line for controlling read/write access to the memory device;
- a bit line for controlling a value to write to the memory device;
- a switch having a source, a drain, and a gate, the switch being connected at the drain to the word line and at the source to the bit line;
- a memory node connected to a drain of the switch;
- a first resonant tunnel diode including an undoped silicon fin surrounded by a dielectric layer; and
- a second resonant tunnel diode including a second undoped silicon fin surrounded by a second dielectric layer, the second resonant tunnel diode connected in series to the first resonant tunnel diode through the memory node.

17. The memory device of claim 16, wherein the undoped silicon fin and the second undoped silicon about 5 nm in width.

18. Then memory device of claim 16, wherein the switch is a FinFET having a plurality of channel regions.

19. The memory device of claim 16, wherein the undoped silicon fin and the second undoped silicon fin are about 5–10 nm in wide such that a current-voltage characteristic curve of a series connection of the first and second resonant tunnel diodes includes four stable states.

* * * * *